(12) United States Patent
Ionescu et al.

(10) Patent No.: US 11,834,739 B2
(45) Date of Patent: Dec. 5, 2023

(54) GRAPHENE PRINTING

(71) Applicant: Hewlett-Packard Development Company, L.P., Spring, TX (US)

(72) Inventors: Robert Ionescu, Palo Alto, CA (US); Helen A Holder, Palo Alto, CA (US); Ning Ge, Palo Alto, CA (US); Jarrid Wittkopf, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 280 days.

(21) Appl. No.: 17/047,015

(22) PCT Filed: Jun. 13, 2018

(86) PCT No.: PCT/US2018/037248
§ 371 (c)(1),
(2) Date: Oct. 12, 2020

(87) PCT Pub. No.: WO2019/240784
PCT Pub. Date: Dec. 19, 2019

(65) Prior Publication Data
US 2021/0087675 A1    Mar. 25, 2021

(51) Int. Cl.
*C23C 16/04* (2006.01)
*C01B 32/186* (2017.01)
*C23C 16/26* (2006.01)
*C23C 16/30* (2006.01)
*C23C 16/48* (2006.01)

(52) U.S. Cl.
CPC .......... *C23C 16/047* (2013.01); *C01B 32/186* (2017.08); *C23C 16/26* (2013.01); *C23C 16/305* (2013.01); *C23C 16/483* (2013.01); *C23C 16/487* (2013.01)

(58) Field of Classification Search
CPC ..... C23C 16/047; C23C 16/487; C23C 16/26; C23C 16/483; C23C 16/305; C01B 32/186
See application file for complete search history.

(56) References Cited

U.S. PATENT DOCUMENTS

| 8,175,734 | B2 | 5/2012 | Fogel |
| 8,868,230 | B2 | 10/2014 | Tschanz |
| 2008/0108209 | A1* | 5/2008 | Kraus ............... H01L 21/26513 257/E21.336 |
| 2009/0324897 | A1* | 12/2009 | Choi ...................... H01L 29/43 427/256 |
| 2012/0223335 | A1* | 9/2012 | Tsuchiya ............... H01L 23/544 257/77 |
| 2013/0189577 | A1 | 7/2013 | Wang et al. |
| 2013/0202813 | A1 | 8/2013 | Chueh et al. |

(Continued)

FOREIGN PATENT DOCUMENTS

| CN | 102344131 B | 2/2012 |
| CN | 104176734 A | 12/2014 |

(Continued)

*Primary Examiner* — Yuechuan Yu
(74) *Attorney, Agent, or Firm* — Michael Dryja

(57) ABSTRACT

Graphene printing is disclosed. A disclosed example graphene printing apparatus includes a gas source to cause a graphene precursor gas to flow across a surface of a substrate, and a localized heat source to locally heat portions of the surface to cause graphene to grow at the portions of the surface based on a printing pattern.

15 Claims, 12 Drawing Sheets

(56) References Cited

U.S. PATENT DOCUMENTS

| | | |
|---|---|---|
| 2013/0327981 A1 | 12/2013 | Yamada et al. |
| 2014/0231002 A1 | 8/2014 | Patil |
| 2017/0361599 A1 | 12/2017 | Lerner et al. |
| 2018/0042245 A1 | 2/2018 | Contractor |

FOREIGN PATENT DOCUMENTS

| | | |
|---|---|---|
| EP | 3064257 | 9/2016 |
| EP | 3131121 B1 | 2/2017 |
| JP | 2006012058 | 1/2006 |
| KR | 101298084 B1 | 8/2013 |
| WO | WO-2011112598 A1 | 9/2011 |
| WO | WO-2017014343 A1 | 1/2017 |

\* cited by examiner

GRAPHENE PRINTING

BACKGROUND

Graphene can be grown onto a substrate via a chemical vapor deposition (CVD) process or roll-to-roll machine processing to alter electrical performance characteristics. The CVD process typically entails placing a substrate into a chamber and providing a graphene precursor gas along with heat to the chamber to cause a layer of graphene to grow onto the substrate. To define a pattern or shape of the graphene, usually the substrate along with the graphene is cut and/or etched after the graphene is grown onto the substrate. Further, numerous applications of photoresist as well as exposure and high temperature processes are performed. These processing steps can be time consuming and expensive.

BRIEF DESCRIPTION OF THE DRAWINGS

The figures are not to scale. Instead, the thickness of the layers or regions may be enlarged in the drawings. In general, the same reference numbers will be used throughout the drawing(s) and accompanying written description to refer to the same or like parts.

DETAILED DESCRIPTION

Graphene printing is disclosed. Graphene can be applied onto a substrate through chemical vapor deposition (CVD) processes. However, defining shapes and/or patterns in graphene often utilizes additional photoresist, temperature processing, etching and/or cutting steps, all of which can entail significant costs and/or additional processing time.

Examples disclosed herein provide a cost-effective and time-efficient manner for applying graphene onto a substrate as defined shapes and/or patterns without utilization of additional etching or cutting processes, thereby saving time and costs. Examples disclosed herein utilize a localized heating source, such as a laser for example, to locally heat a portion of a substrate while a graphene precursor gas flows over the portion of the substrate. In particular, a desired pattern may be used to direct or aim the localized heating source to heat portions of the substrate, thereby causing graphene to grow on the portions of the substrate. In other words, locally heated portions of the substrate are used to define a graphene printed image or pattern.

In some examples, the localized heating source is implemented as a laser. In other examples, the localized heating source is implemented as a resistance device. In some examples, an orientation or aim of the localized heating source is varied by an actuator. Additionally or alternatively, a printer carriage is used to move and/or rotate the localized heating source. In some examples, molybdenum is applied to the printed graphene (e.g., as molybdenum disulfide). In particular, the molybdenum can be used to coat at least portions of the printed graphene.

As used herein, the term "pattern" refers to an image, shape, text, a symbol, a logo, indicia, and/or a representation, etc. As used herein, the term "laser device" refers to a laser-emitting device and/or laser generating source. As used herein, the term "movement device" refers to a device that guides or facilitates movement including, but not limited to, an actuator, a motor, a solenoid, gearing and/or a linkage device, etc. As used herein, the term "graphene precursor gas" refers to any carbon containing gas and/or mixture that can enable growth of graphene onto a substrate surface. Accordingly, the term "graphene precursor gas" can refer to any compound, mixture and/or reactant used to grow graphene. Likewise, the term "precursor gas" refers to a compound, mixture and/or reactant used to produce to grow material corresponding to the precursor gas.

Figures 1A, 1B:
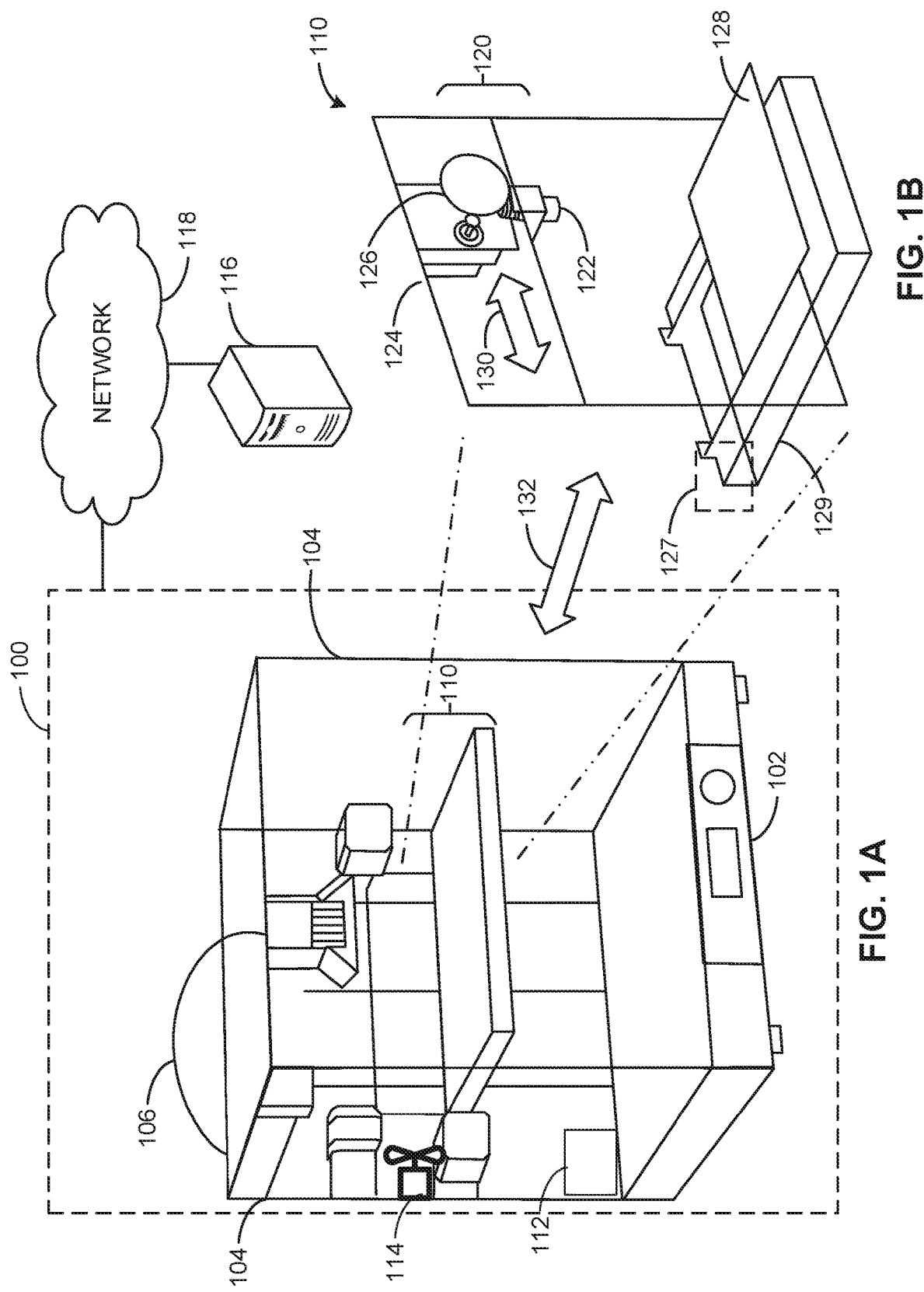
FIG. 1A illustrates an example printer in accordance with the teachings of this disclosure.
FIG. 1B is a detailed view of a portion of the printer of FIG. 1A.

FIG. 1A illustrates an example printer 100 in accordance with the teachings of this disclosure. The printer 100 of the illustrated example includes a controller 102, a subframe 104, which defines a chamber (e.g., a gas chamber) of the printer 100, a printhead data interface 106, and a printhead portion (e.g., a print bed) 110. Further, the example printer 100 includes a temperature check closed-loop monitoring system 112, which can be implemented as an infrared sensor for example, and a cooling device 114, which is implemented as a fan in this example. In this example, the printer 100 is communicatively coupled to a workstation 116 via a network (e.g., a wired network, a local area network (LAN), a wireless network, the Internet, etc.) 118. While the example shown in FIG. 1A includes an example network topology, any appropriate network or communication topology may be implemented.

FIG. 1B is a detailed view of the printhead portion 110 of the printer 100 of FIG. 1A. According to the illustrated example, the printhead portion 110 includes a printhead (e.g., a movable printhead) 120. The example printhead 120 includes a localized heat source 122. In this example, the localized heat source 122 is a laser device that is movably coupled to a printhead support (e.g., a printhead frame) 124 via a first movement device 126. In this example, the first movement device 126 is implemented as a motorized or actuated printer carriage. In addition, the example printhead portion 110 includes a second movement device 127 that moves the printhead support 124 along with the localized heat source 122 in a different direction from that of the first movement device 126 (e.g., in an orthogonal direction from a direction associated with the first movement device 126). Further, the example printhead portion 110 also includes a printing surface (e.g., a print surface bed) 128 as well as a base structure 129.

To move the example printhead 120, the first movement device 126 moves the localized heat source 122 in directions generally indicated by a double arrow 130 and the printhead support 124 is moved by the second movement device 127 along directions generally indicated by a double arrow 132. In other words, the printhead 120 is moved in at least two different directions (e.g., horizontal and vertical or x-y directions and/or a z-direction of the printing surface 128). However, the printhead 120 can be moved in any number of translational directions and orientations. Additionally or alternatively, the first movement device 126 orients (e.g., aims, angles, angularly rotates, etc.) the localized heat source 122 towards portions of a substrate in addition to translational movement. In such examples, an actuator or motor can be implemented to orient and re-orient the localized heat source 122.

Figure 2A:
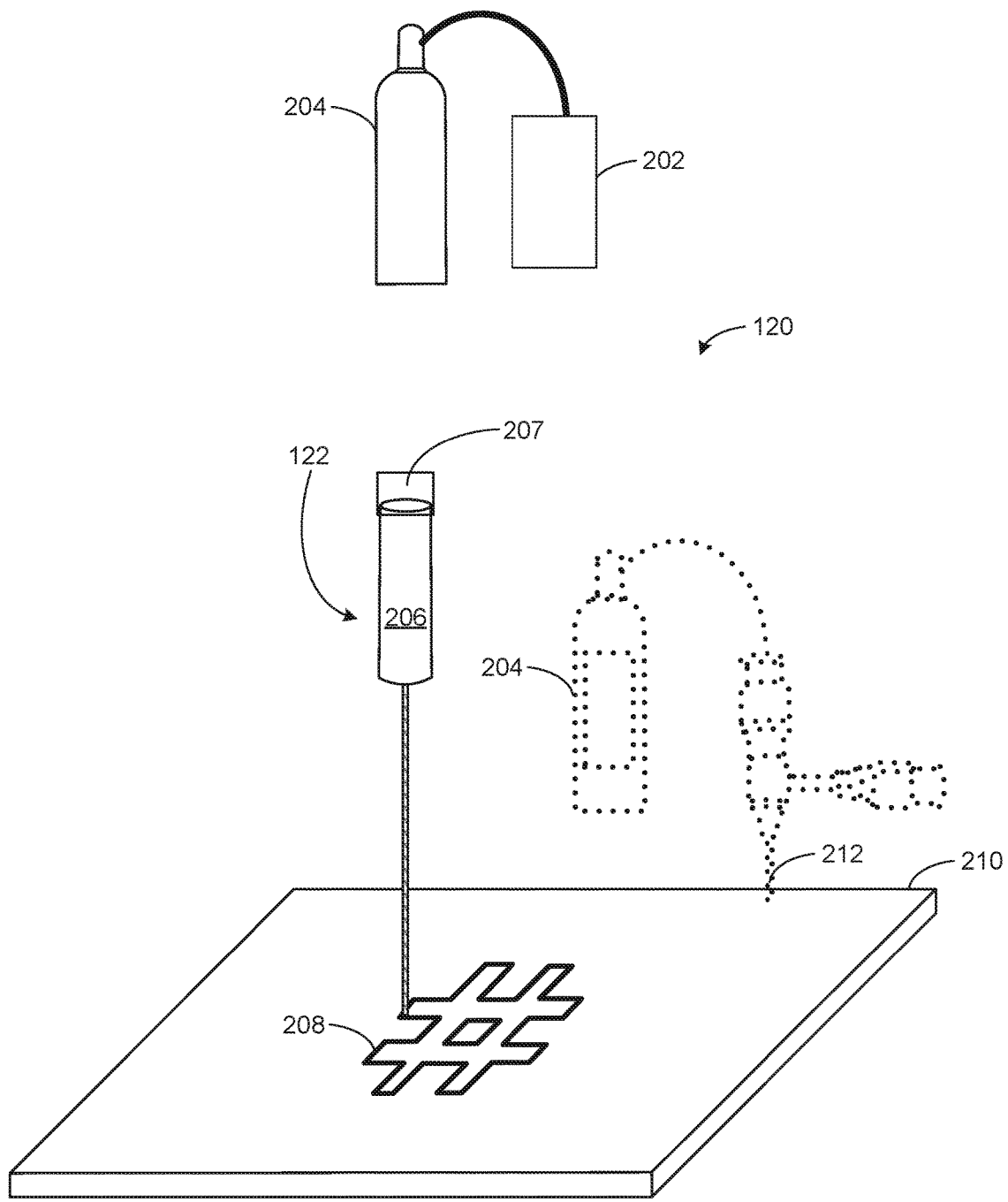
FIG. 2A illustrates an example printhead of the example printer of FIGS. 1A and 1B.

FIG. 2A illustrates the example printhead 120 of the printhead portion 110 of the example printer 100 of FIGS. 1A and 1B. As can be seen in the illustrated example of FIG. 2A, a fluid emitter 202 is fluidly coupled to a graphene precursor source (e.g., a graphene precursor gas tank) 204. The printhead 120 also includes the localized heat source 122, which includes a laser device (e.g., a laser, a directional laser, a laser beam source, etc.) 206. In some examples, the printhead 120 also includes a directional movement device (e.g., an actuator, a rotational actuator, etc.) 207 to aim the localized heat source 122 and/or the laser device 206. While the example of FIG. 2A is described in the context of a laser-based implementation, any appropriate energy delivery device or system can be implemented.

According to the illustrated example of FIG. 2A, the printhead 120 is controlled to print graphene 208 onto a substrate (e.g., a copper substrate) 210 as a pattern. In this example, the substrate 210 is at least partially composed of copper (e.g., a copper foil, a copper plate, etc.). Additionally or alternatively, the substrate 210 is at least partially composed of nickel. However, in other examples other suitable or desirable substrate material or combination of materials may be used. For example, materials including, but not limited to, silicon, stainless steel and/or silicon dioxide can be substrates to be printed with graphene.

In operation, the printhead 120 along with the localized heat source 122 is translated and/or rotated relative to the substrate 210 based on the pattern. Once the printhead 120 is moved so that the localized heat source 122 is directed towards and/or onto a portion of the substrate 210 that is to be printed with graphene, the fluid emitter 202 provides the graphene precursor gas from the graphene precursor gas source 204 onto the portion of the substrate 210, thereby causing the graphene 208 to locally form on portions of the substrate 210 when the substrate 210 cools. For example, the cooling can be provided by the fan 114 shown in FIG. 1. In other examples, the substrate 210 can be locally cooled (e.g., by a thermoelectric cooler, liquid cooled, etc.). In some examples, the cooling enables control of how many graphene layers are to be grown.

In this example, the graphene precursor gas is implemented as either $C_2H_2$ or $C_2H_4$ (e.g., in combination with argon gas and/or hydrogen gas). In this particular example, the graphene precursor gas continuously flows across areas of the substrate 210 that are not be printed while the localized heat source 122 is directed to portions of the substrate 210.

In other examples, the fluid emitter 202 is moved and/or oriented along with the localized heat source 122. In such examples, the fluid emitter 202 is aimed to direct the graphene precursor gas onto localized portions of the substrate 210. Additionally or alternatively, the fluid emitter 202 is implemented as a needle nozzle 212 and is generally aimed or directed to portions proximate the substrate 210 (e.g., moved independent of the localized heat source 122). In some examples, the graphene precursor gas is caused to flow perpendicular to a direction in which the localized heat source 122 is oriented. In some examples, the portions of the substrate 210 are heated to approximately 700 to 1000 degrees Celsius. In some examples, category III and IV elements from the periodic table are applied onto the graphene 208 after the graphene 208 is printed.

Additionally or alternatively, molybdenum is applied to the graphene 208. In particular, molybdenum disulfide may be provided to the graphene 208. In some examples, gold or silver leads are printed onto the graphene 208 and/or the substrate 210. In some other examples, the substrate 210 is composed of silicon and/or silicon dioxide.

While the graphene 208 is grown utilizing localized heat (e.g., by locally heating the substrate 210) in this example, other elements and/or compounds may be grown on the substrate 210. In some examples, inks in the form of $(NH_4)_2MX_4$ are heated (e.g., using examples disclosed herein) to transition to $MX_2$ form where M symbolizes a transition metal and X symbolizes a dichalcogenide. The $MX_2$ form is a semiconductor material. One particular example includes $(NH_4)_2MoS_4$ being heated and turning into $MoS_2$, where Mo is the M and the S is the X in the generic formula. Accordingly, there are multiple examples of these semiconductor materials that can be implemented according to a such generic formula, for example.

In some examples, materials are printed over the graphene printing. For example, the inks may be jet printed onto graphene then heated using examples disclosed herein to make them into $MX_2$ described above. This enables new methods of defining semiconductor stacks that previously were not able to be achieved without transfer, etching, and any additional fabrication processes.

Accordingly, any appropriate precursor gas and/or precursor delivery mechanism can be implemented. While $C_2H_2$ and/or $C_2H_4$ are implemented in this example, other suitable carbon precursor gases can be implemented instead. In some examples, the gas precursors are provided to a printing chamber through a controlled flow meter from the top of the chamber via a needle or spray head.

Figure 2B:
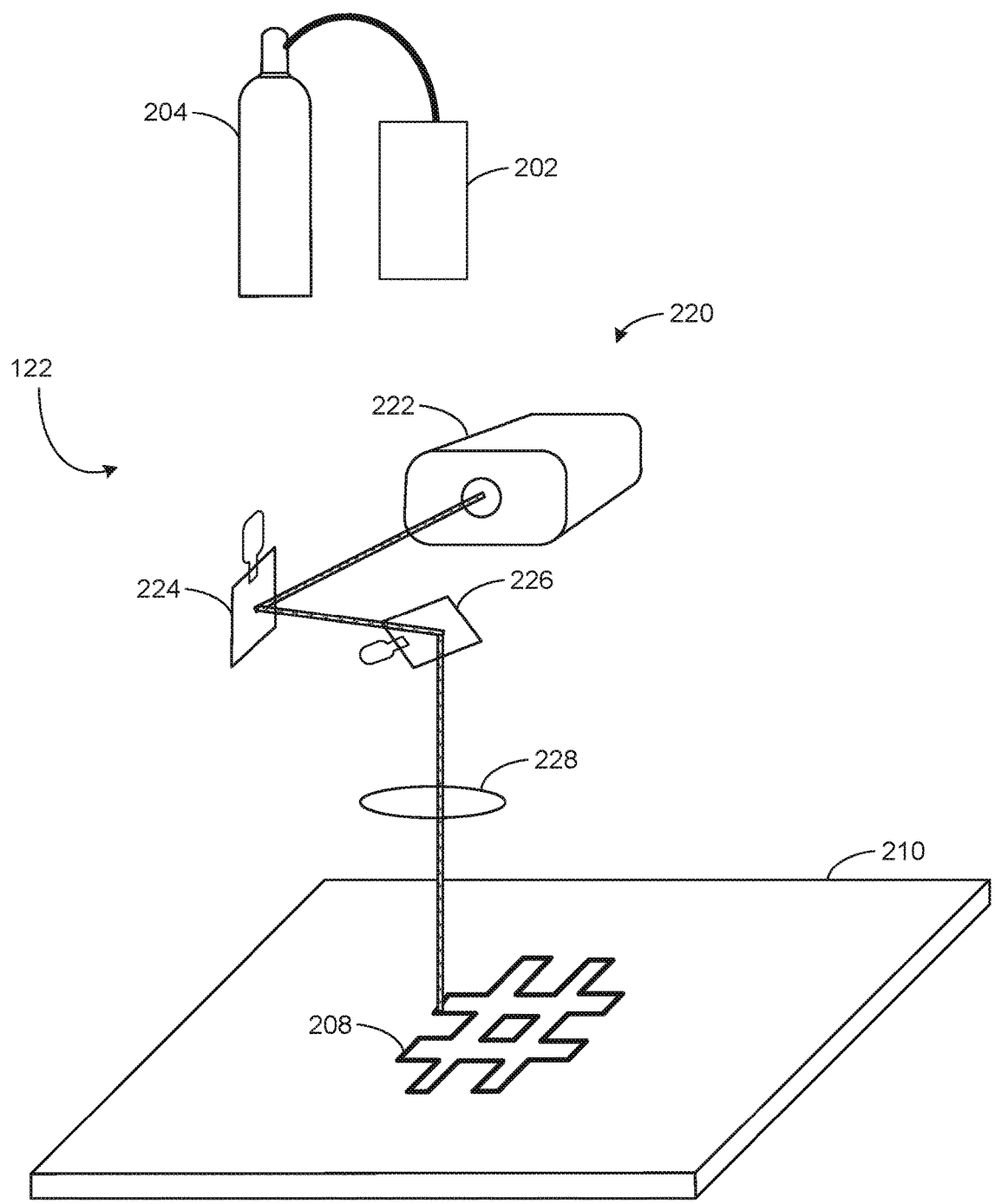
FIGS. 2B-2D illustrate alternative example printheads that may be implemented in examples disclosed herein.

FIG. 2B illustrates an alternative printhead 220 that may be implemented in examples disclosed herein. The example printhead 220 is similar to the printhead 120 of FIGS. 1B and 2A, but instead generates a laser beam that can be oriented in both x and y directions via mirror movement. The printhead 220 of the illustrated example includes a driver 222, a y-axis rotating mirror 224, an x-axis rotating mirror 226 and a flat field scan lens 228. In some examples, the printhead 220 is not moved by a print carriage in contrast to the example printhead 120 of FIGS. 1B and 2A. In operation, the x-axis rotating mirror 226 and the y-axis rotating mirror 224 are each rotated based on a desired pattern while the graphene precursor gas source 204 provides graphene precursor gas to a surface of the substrate 210.

Figure 2C:
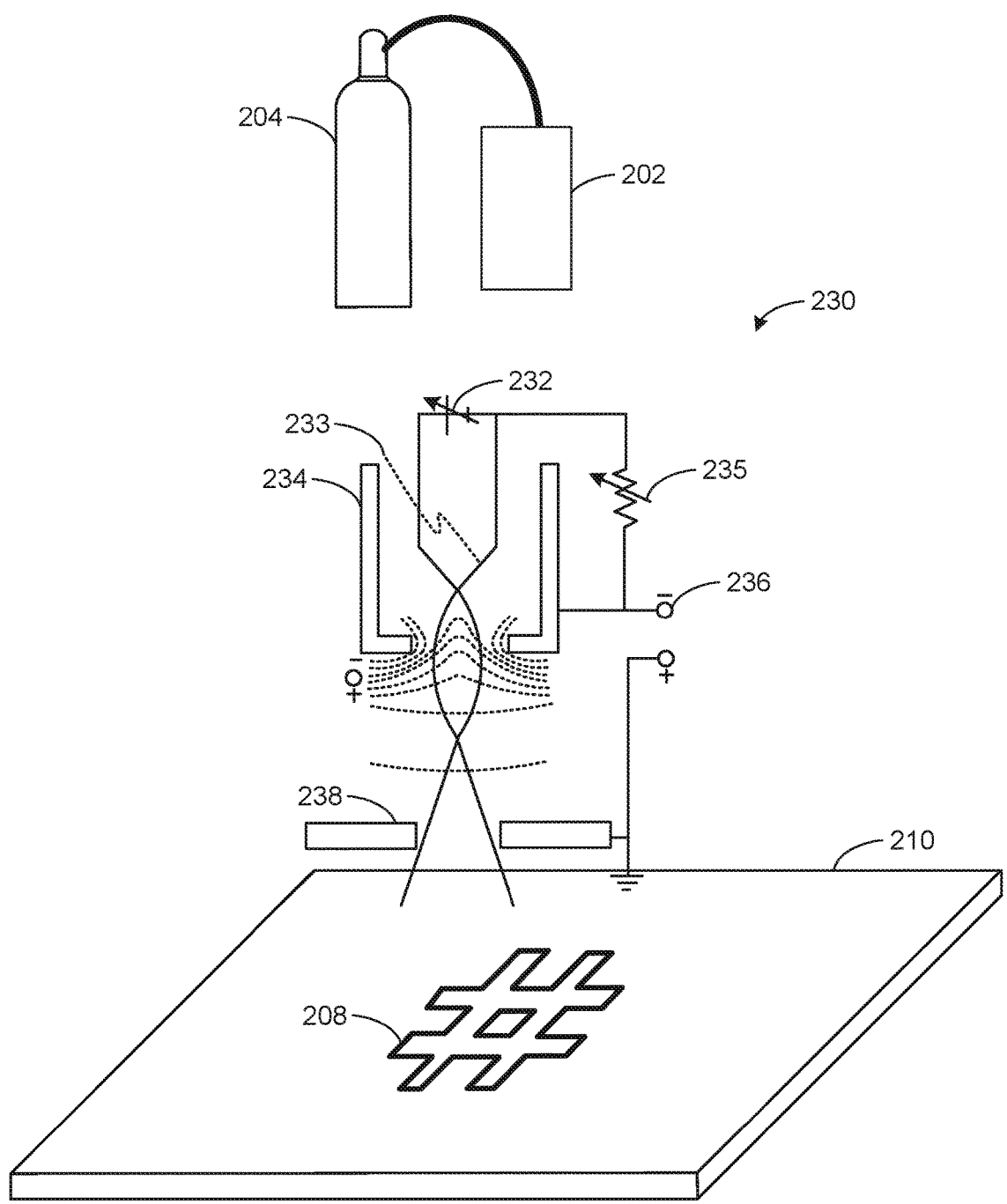

Turning to FIG. 2C, an alternative printhead 230 is shown. The printhead 230 of the illustrated example includes a filament heating supply 232, a filament 233, a grid cap 234, a bias resistance 235, a high voltage supply 236 and an anode plate 238. In this example, the printhead 230 generates a beam current towards the substrate 210.

Figure 2D:
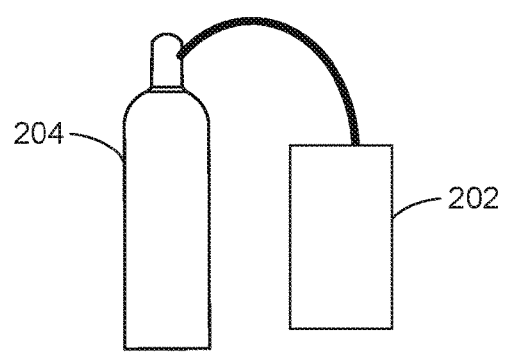
Figure 2D:
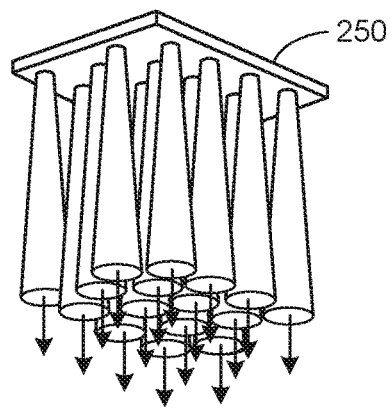
Figure 2D:
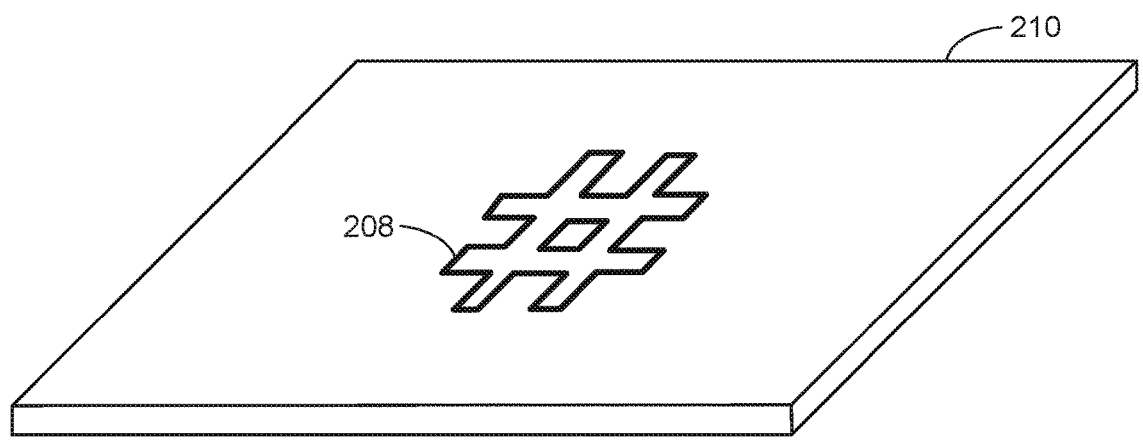

FIG. 2D depicts a vertical external cavity surface-emitting laser (VCSEL) 250. In this example, the VCSEL 250 is implemented as a laser diode array. In operation, specific diodes of the laser diode array are directed to project a beam to the substrate 210 based on a desired pattern. In other words, the VCSEL activates select multiple laser beams corresponding to a shape of the desired pattern.

Figure 3:
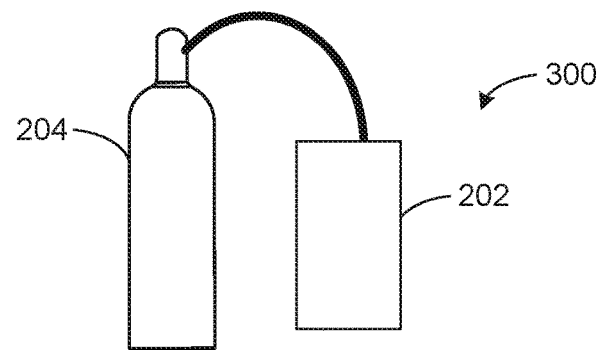
FIG. 3 illustrates an alternative example shaped contact printhead.
Figure 3:
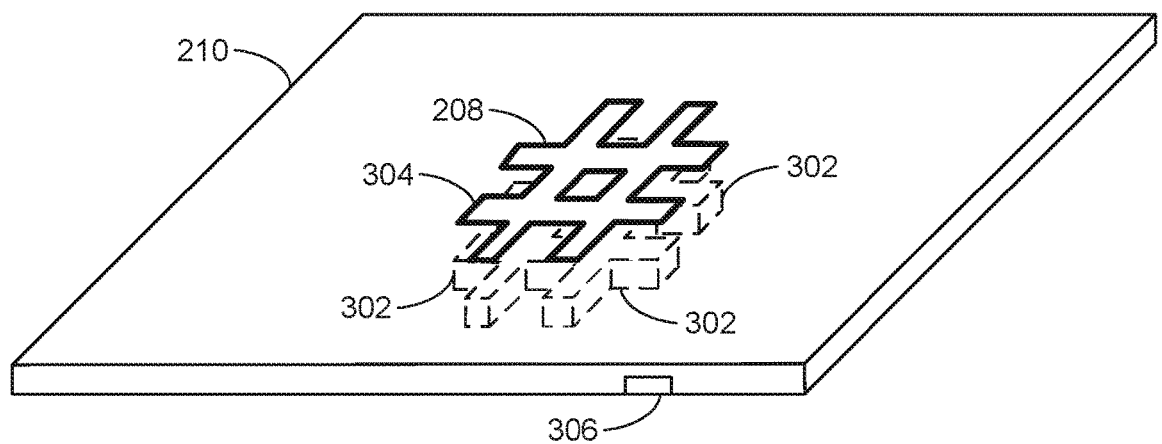

FIG. 3 is a detailed view of an alternative example shaped contact printhead 300. The printhead 300 of the illustrated example is similar to the examples of FIGS. 2A-2D, but does not utilize a printhead-mounted or overhead heating source. Instead of a laser or other directional energy source, a heating pad array 302 is shaped or contoured to define a printed graphene pattern 304 onto the substrate 210. In this example, the fluid emitter 202 and the graphene precursor gas source 204 of FIGS. 2A-2D are implemented.

In operation, graphene precursor gas flows from the graphene precursor gas source 204 and out of the emitter 202 onto a surface of the substrate 210. As a result of the heating pad array 302 causing localized heating to portions of the substrate 210, the pattern 304 is printed onto the substrate 210. In this example, the heating pad array 302 is shaped to define the printed pattern 304. In this example, the heating pad array 302 heats a side opposite a side on which the graphene precursor gas flows. However, in other examples, the heating pad array 302 can heat the side that the graphene precursor gas flows across. In some examples, the heating pattern array is cut and/or etched in the shape of a desired graphene printing pattern (e.g., a design pattern). In some examples, the heating pad array 302 is inserted into openings (e.g., partial depth openings) 306 of the substrate 210.

In some other examples, at least portions of the heating pad array 302 are moved relative to the substrate 210 during a printing process. For example, the heating pad array 302 can be moved across the substrate 210 while the graphene precursor gas is caused to flow proximate the heating pad array 302 as the heating pad array 302 moves. In some examples, the heating pad array 302 is at least partially composed of stainless steel.

Figure 4:
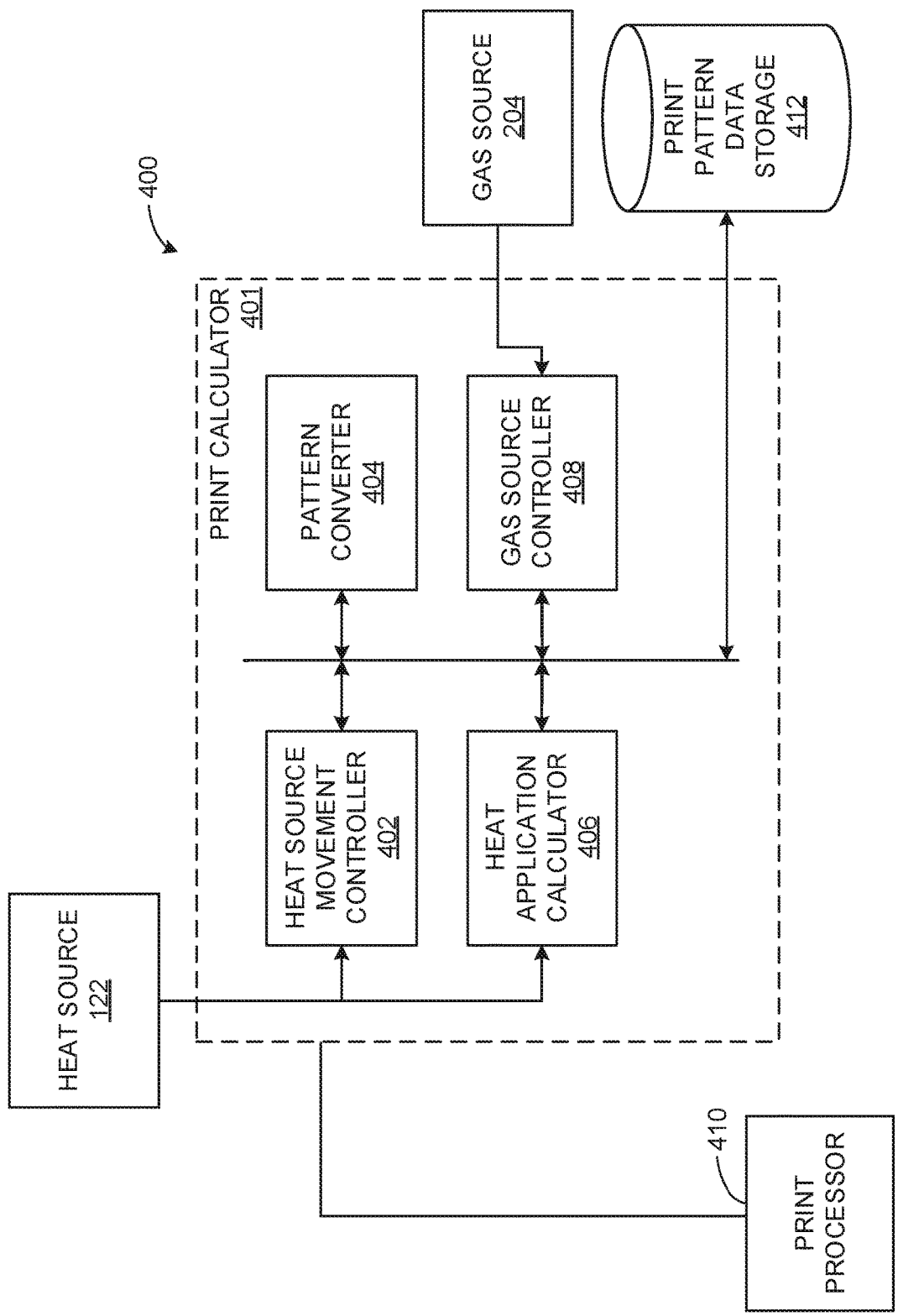
FIG. 4 is a schematic overview of an example graphene printing controller that can be implemented in examples disclosed herein.

FIG. 4 is a schematic overview of an example graphene printing controller 400 that can be implemented in examples disclosed herein. The printing controller 400 can be implemented in the controller 102 and/or the workstation 116 shown in FIG. 1A. The graphene printing controller 400 of the illustrated example includes a print calculator 401, which includes a heat source movement controller 402, a pattern converter 404, a heat application calculator 406 and a gas source controller 408. Further, the graphene printing controller 400 is communicatively coupled to a print processor 410 as well as a print pattern data storage 412.

To define a pattern to be printed in graphene, the pattern converter 404 of the illustrated example generates a print pattern based on an image, such as a logo for example. In some examples, the pattern converter 404 converts image data, such as an image file, into a pattern to be printed in graphene onto the substrate 210. The pattern may represent an image, text, a logo and/or a symbol or other indicia, for example. In some examples, the pattern is scaled (e.g., scaled based on substrate area available) by the pattern converter 404.

To determine a movement of the printhead 120 and/or the localized heat source 122 to print the graphene onto portions of the substrate 210, the heat source movement controller 402 of the illustrated example controls and/or determines a how to translate and/or rotate the localized heat source 122. In particular, the example heat source movement controller 402 determines a movement or path of the localized heat source 122 relative to the substrate 210 based on the pattern generated by the pattern converter 404.

According to the illustrated example, the heat application controller 406 controls a degree to which the localized heat source 122 heats portions of the substrate 210 to cause graphene growth onto the substrate 210. In other words, the heat application controller 406 is used to control an amount of heat provided to portion(s) of the substrate 210 from the localized heat source 122. In some examples, a degree to which heat is applied across the substrate 210 is varied to create a gradient and/or printing effect (e.g., a faded or gradient transition effect of the printed graphene). In some examples, the heat application controller 406 varies an amount of heat applied across different areas of a surface of the substrate 210.

The example gas source controller 408 directs a degree to which graphene precursor gas flows from the gas source 204 to the substrate 210. In particular, the gas source controller 408 controls an amount of flow (i.e., a flow rate) of the graphene precursor gas. Additionally or alternatively, the gas source controller controls a direction of flow of the graphene precursor gas towards the substrate 210. In some examples, a highly localized flow of the graphene precursor gas is provided to portions of the substrate 210, thereby conserving the graphene precursor gas.

In this example, the print processor 410 directs movement of the movement devices 126, 127 based on the generated pattern. In particular, the print processor 410 coordinates movement of the movement devices 126, 127 to move the localized heat source 122 relative to the substrate 210 based on a pattern to be printed onto the substrate 210.

The print pattern data storage 412 of the illustrated example stores pattern information, image data and/or image conversion data. In some examples, temperature(s), amount of gas used, and operational data is stored in the print pattern data storage 412. Additionally or alternatively, movement data associated with the printhead 120 is stored in the print pattern data storage 412.

Figure 5:
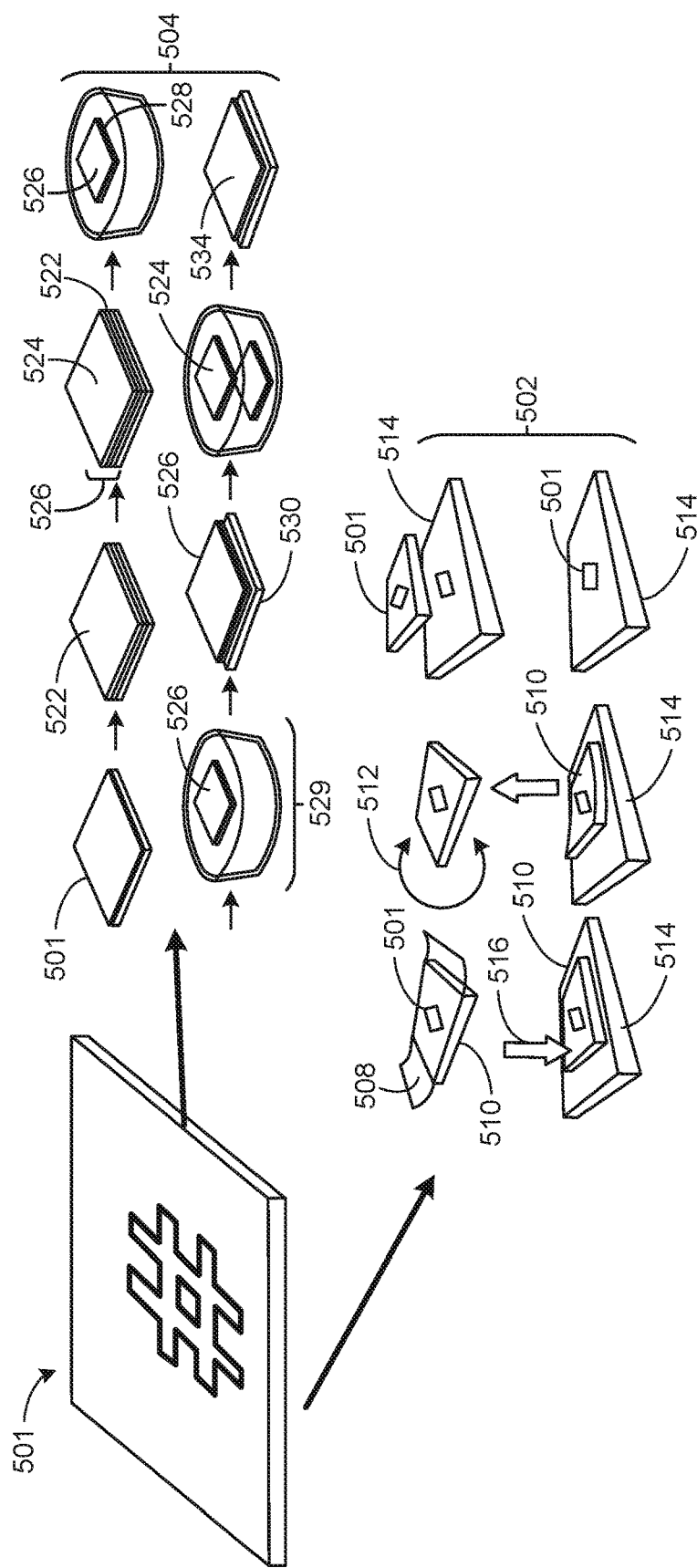
FIG. 5 illustrates example post-printing processing that may be implemented with examples disclosed herein.

FIG. 5 illustrates example post-printing processing that may be implemented with examples disclosed herein for further transferring purposes. In particular, FIG. 5 illustrates additional packaging, transferring and/or processing of a printed graphene substrate 501 that may be implemented in conjunction with examples disclosed herein once graphene is printed onto a substrate. Process 502 designates a "dry" gel transfer process (e.g., a Polydimethylsiloxane transfer process) while process 504 illustrates an alternative "wet" etching process. According to the illustrated example, the printed substrate 501 can be processed with the dry process 502 and/or the wet process 504.

The example dry process 502 includes the printed substrate 501 being transferred from a tape 508 to a stamp 510. The stamp 510 is turned (e.g., flipped or rotated 180°) so that the printed substrate 501 is facing downward (in the view of FIG. 5). The printed substrate 501 is aligned with another substrate 514. The stamp 510 is pressed against the printed substrate 501, as generally indicated by arrow 516. The stamp 510 is peeled off from the substrate 514, thereby causing the printed substrate 501 to be transferred to the substrate 514.

The example wet process 504 includes the printed substrate 501 being provided with a polyvinyl alcohol (PVA) coating 522 which, in turn, is provided with a Poly(methyl methacrylate) (PMMA) coating 524, thereby defining a layered stack 526. A copper layer 528 of the layered stack 526 is etched, and an exposed surface resulting from the etching is cleaned 529. The layered stack 526 is transferred to a target substrate 530, the PMMA coating 524 is removed, and a drying process reveals an exposed surface of graphene 534.

While an example manner of implementing the graphene printing controller 400 of FIG. 4 is illustrated in FIG. 4, one or more of the elements, processes and/or devices illustrated in FIG. 4 may be combined, divided, re-arranged, omitted, eliminated and/or implemented in any other way. Further, the example print calculator 401, the example heat source movement controller 402, the example pattern converter 404, the example heat application calculator 406, the example gas source controller 408, the example print processor 410 and/or, more generally, the example graphene printing controller 400 of FIG. 4 may be implemented by hardware, software, firmware and/or any combination of hardware, software and/or firmware. Thus, for example, any of the example print calculator 401, the example heat source movement controller 402, the example pattern converter 404, the example heat application calculator 406, the example gas source controller 408, the print processor 410 and/or, more generally, the example graphene printing controller 400 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example print calculator 401, the example heat source movement controller 402, the example pattern converter 404, the example heat application calculator 406, the example gas source controller 408, and/or the example print processor 410 is/are hereby expressly defined to include a non-transitory computer readable storage device or storage disk such as a memory, a digital versatile disk (DVD), a compact disk (CD), a Blu-ray disk, etc. including the software and/or firmware. Further still, the example graphene printing controller 400 of FIG. 4 may include one or more elements, processes and/or devices in addition to, or instead of, those illustrated in FIG. 4, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 6:
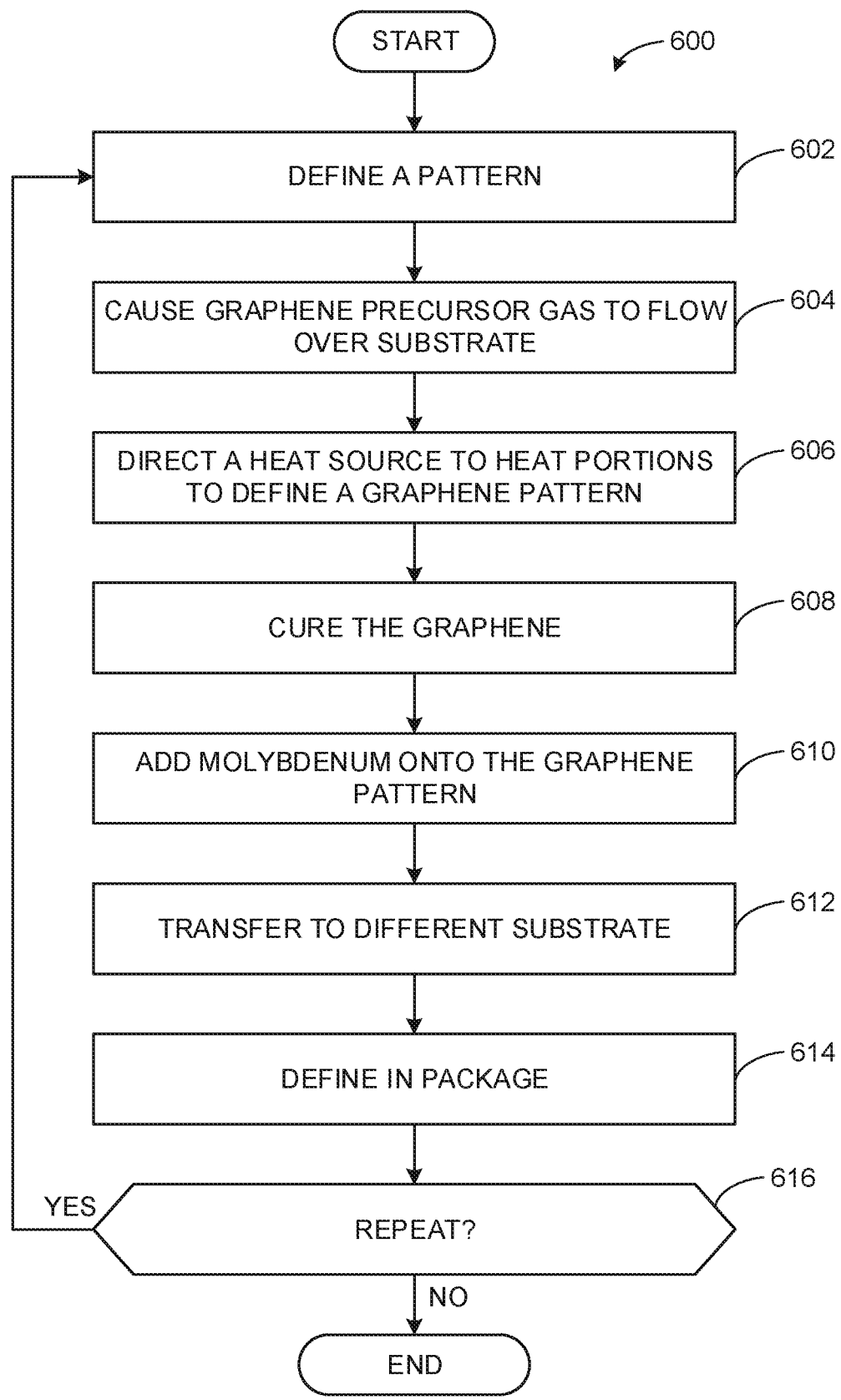
FIG. 6 is a flowchart representative of an example method which may be executed to implement examples disclosed herein.

A flowchart representative of example hardware logic, machine readable instructions, hardware implemented state machines, and/or any combination thereof for implementing the graphene printing controller 400 of FIG. 4 is shown in FIG. 6. The machine readable instructions may be an executable program or portion of an executable program for execution by a computer processor such as the processor 712 shown in the example processor platform 700 discussed below in connection with FIG. 7. The program may be embodied in software stored on a non-transitory computer readable storage medium such as a CD-ROM, a floppy disk, a hard drive, a DVD, a Blu-ray disk, or a memory associated with the processor 712, but the entire program and/or parts thereof could alternatively be executed by a device other than the processor 712 and/or embodied in firmware or dedicated hardware. Further, although the example program is described with reference to the flowchart illustrated in FIG. 6, many other methods of implementing the example graphene printing controller 400 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIG. 6 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

The example method 600 of FIG. 6 includes a device (e.g., an electrical device, a semiconductor device, a transistor device, etc.) being defined with a graphene layer and/or structure. According to the illustrated example, the pattern converter 404 defines a pattern to be printed (block 602). In some examples, the pattern converter 404 receives an image to be converted to a pattern.

The example gas source controller 408 causes graphene precursor gas to flow over the substrate 210 (block 604). In this example, the gas source controller 408 controls a flow rate value of the graphene precursor gas flowing over portions of the substrate 210. Additionally or alternatively, the gas source controller 408 controls a direction of flow of the graphene precursor gas.

The heat source movement controller 402 of the illustrated example directs the localized heat source 122 to be oriented or moved towards portions of the substrate 210 provided with the graphene precursor gas to define a graphene printed pattern (block 606).

In some examples, the graphene printed onto the substrate 210 is cured (block 608). For example, the graphene can be cured in an oven along with the substrate 210.

In some examples, molybdenum is added to the graphene (block 610). In particular, the molybdenum can be added as molybdenum disulfide, for example. In some examples, the molybdenum is further heated upon application to the graphene.

In some examples, the printed graphene is transferred to another substrate (block 612). For example, the process utilized in such a transfer process can be any of the examples disclosed above in conjunction with FIG. 5.

Additionally or alternatively, the printed graphene is defined in a package (block 614). For example, the printed graphene is transferred and/or applied to the package (e.g., a device package, etc.).

The example process 600 also includes determining whether to repeat the process 600 (block 616) to form an additional pattern on the substrate 210 or an additional pattern on an additional substrate. If the process 600 is to be repeated (block 616), control of the process 600 returns to block 602. Otherwise, the process 600 ends.

Figure 7:
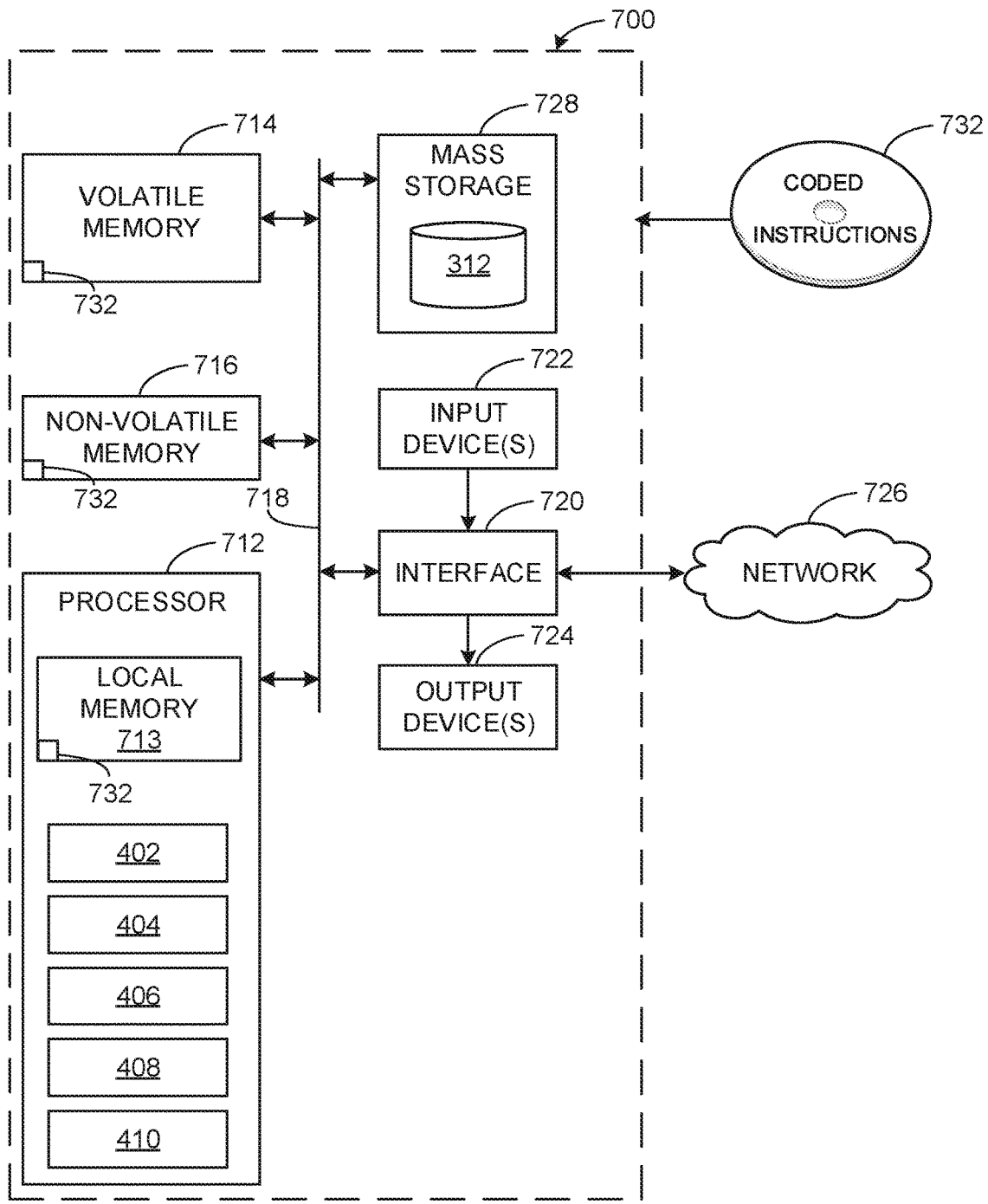
FIG. 7 is a block diagram of an example processing platform structured to execute the instructions of FIG. 6 to implement examples disclosed herein.

FIG. 7 is a block diagram of an example processor platform 1000 structured to execute the instructions of FIG. 6 to implement the graphene printing controller 400 of FIG. 4. The processor platform 700 can be, for example, a server, a personal computer, a workstation, a self-learning machine (e.g., a neural network), a mobile device (e.g., a cell phone, a smart phone, a tablet such as an iPad'), a personal digital assistant (PDA), an Internet appliance, or any other type of computing device.

The processor platform 700 of the illustrated example includes a processor 712. The processor 712 of the illustrated example is hardware. For example, the processor 712 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements heat source movement controller 402, the example pattern converter 404, the example heat application calculator 406, the example gas source controller 408 and the example print processor 410.

The processor 712 of the illustrated example includes a local memory 713 (e.g., a cache). The processor 712 of the illustrated example is in communication with a main memory including a volatile memory 714 and a non-volatile memory 716 via a bus 718. The volatile memory 714 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 716 may be implemented by flash memory and/or any other desired type of memory device. Access to the main memory 714, 716 is controlled by a memory controller.

The processor platform 700 of the illustrated example also includes an interface circuit 720. The interface circuit 720 may be implemented by any type of interface standard, such as an Ethernet interface, a universal serial bus (USB), a Bluetooth® interface, a near field communication (NFC) interface, and/or a PCI express interface.

In the illustrated example, one or more input devices 722 are connected to the interface circuit 720. The input device(s) 722 permit(s) a user to enter data and/or commands into the processor 712. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 724 are also connected to the interface circuit 720 of the illustrated example. The output devices 724 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 720 of the illustrated example, thus, typically includes a graphics driver card, a graphics driver chip and/or a graphics driver processor.

The interface circuit 720 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 726. The communication can be via, for example, an Ethernet connection, a digital subscriber line (DSL) connection, a telephone line connection, a coaxial cable system, a satellite system, a line-of-site wireless system, a cellular telephone system, etc.

The processor platform 700 of the illustrated example also includes one or more mass storage devices 728 for storing software and/or data. Examples of such mass storage devices 728 include floppy disk drives, hard drive disks, compact disk drives, Blu-ray disk drives, redundant array of independent disks (RAID) systems, and digital versatile disk (DVD) drives.

The machine executable instructions 732 of FIG. 7 may be stored in the mass storage device 728, in the volatile memory 714, in the non-volatile memory 716, and/or on a removable non-transitory computer readable storage medium such as a CD or DVD.

Figure 8:
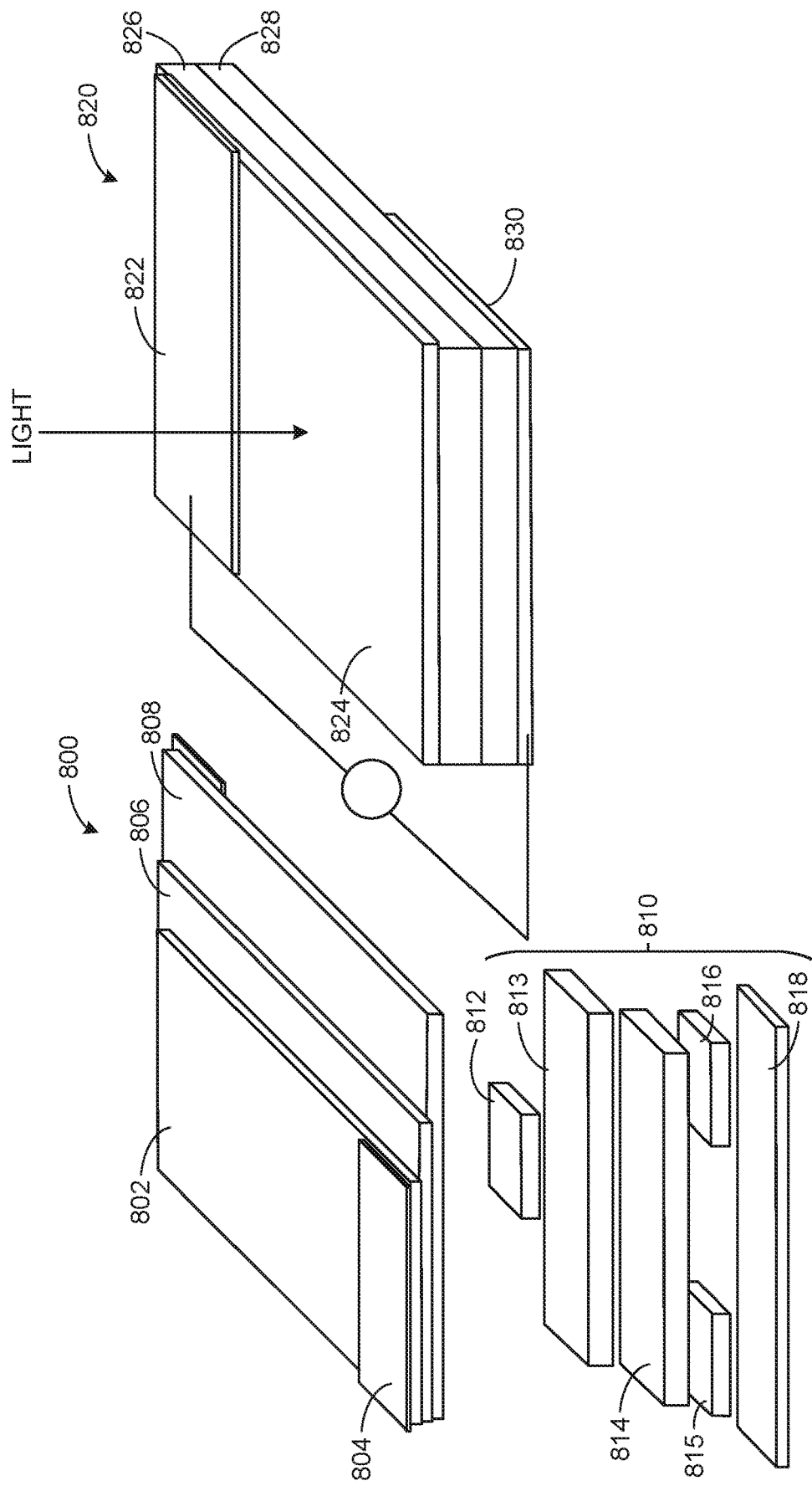
FIG. 8 illustrates example printed devices that may be produced using examples disclosed herein.

FIG. 8 illustrates example printed devices that may be produced using examples disclosed herein. A first example device 800 includes an N-doped molybdenum disulfide layer 802, a gold contact 804, a P-doped molybdenum disulfide layer 806, and a printed graphene layer 808. In some examples, other layers besides the printed graphene layer 808 are also printed using the printer 100.

A semiconductor transistor device 810 is also shown in the example of FIG. 8, which also can be printed using examples disclosed herein. The transistor device 810 includes a gate 812, a dielectric layer 813, a semiconductor material layer 814, a source 815, a drain 816 and a substrate 818.

Another example structure is a photovoltaic cell 820 that includes portions that may be printed using examples disclosed herein. The example photovoltaic cell 820 includes a titanium/gold strip 822, a graphene anode 824, a P-doped molybdenum disulfide layer 826, an N-doped molybdenum disulfide layer 828, and a gold cathode 830. In addition to the printing examples disclosed herein, the photovoltaic cell 820 is formed with transfer and etching processes.

Figure 9B:
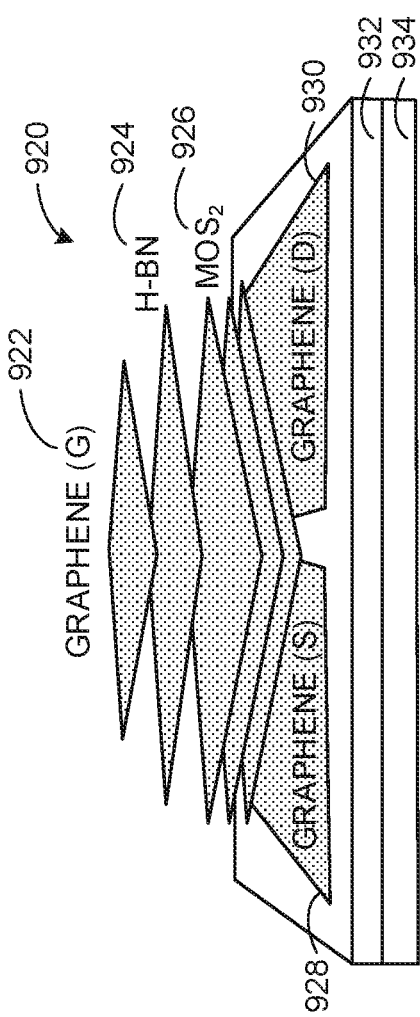
FIGS. 9A and 9B illustrate example microelectromechanical systems (MEMS) devices that can be implemented using examples disclosed herein.
Figure 9A:
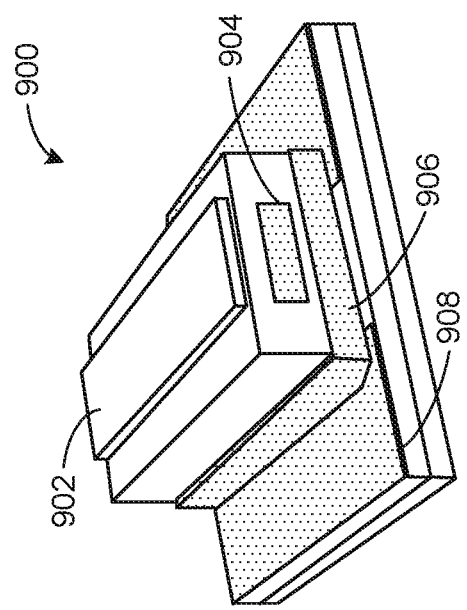

FIGS. 9A and 9B illustrate example microelectromechanical systems (MEMS) devices that can be produced or retrofitted (e.g., retrofitted with printed graphene after production) using examples disclosed herein. In particular, graphene can be advantageously printed onto MEMS devices (e.g., MEMS devices in production or already produced MEMS devices) for relatively high heat dissipation, for example.

Turning to FIG. 9A, an example non-volatile memory cell 900 is shown. The example non-volatile memory cell 900 includes a control gate 902, a few-layer graphene floating gate 904, mono layer molybdenum disulfide layer 906 and a graphene electrode 908.

FIG. 9B depicts an example graphene-molybdenum layer structure 920. The graphene layer structure 920 includes a graphene layer 922, an h-BN layer 924, a molybdenum disulfide layer 926, a graphene source 928, a graphene drain 930 and silicon dioxide layer 932 along with a silicon layer 934.

An example graphene printing apparatus includes a gas source to cause a graphene precursor gas to flow across a surface of a substrate, and a localized heat source to locally heat portions of the surface to cause graphene to grow at the portions of the surface based on a printing pattern.

In some examples, the localized heat source includes a laser device. In some examples, the localized heat source includes an electron beam or a vertical cavity surface emitting laser (VCSEL) array. In some examples, the graphene printing apparatus further includes a movement device to move the laser device based on the printing pattern. In some examples, the graphene printing apparatus further includes a movable printhead to move the localized heat source relative to the surface in at least one of an x-direction, a y-direction, and a z-direction. In some examples, the graphene printing apparatus further includes an actuator to rotate the localized heat source based on the printing pattern.

In some examples, the substrate includes copper. In some examples, the localized heat source is applied to a surface of the copper substrate that is opposite of the surface on which the graphene precursor gas is to flow. In some examples, the graphene printing apparatus further includes a gas chamber, where the surface is to be disposed in the gas chamber.

An example method of printing graphene onto a substrate includes causing a graphene precursor gas to flow across a surface of the substrate, and directing, based on a pattern, a heat source to locally heat portions of the surface to cause graphene to grow on the portions of the surface. In some examples, the method further includes defining, by executing instructions with a processor, the pattern based on an image. In some examples, the method further includes adding molybdenum disulfide onto the graphene. In some examples, the method further includes varying an amount of heat applied by the heat source across different areas of the surface. In some examples, varying an amount of heat applied by the heat source across different areas of the surface. In some examples, directing the heat source includes moving a laser with a printer carriage.

From the foregoing, it will be appreciated that example methods, apparatus and articles of manufacture have been disclosed that provide a cost-effective and accurate manner of printing graphene that can reduce and/or eliminate the need for etching or cutting processes, which can have significant costs and processing time.

An example machine readable medium includes instructions, which when executed, cause a processor to at least calculate a movement of a localized heat source based on a pattern, where the localized heat source is to be directed towards a surface of a substrate, where graphene precursor gas is to flow across the surface, and direct movement of the localized heat source based on the pattern.

In some examples, the instructions cause the processor to generate the pattern based on image data. In some examples, the instructions cause the processor to vary an amount of heat from the localized heat source across the surface based on the pattern. In some examples, the movement of the localized heat source includes moving a laser. In some examples, the movement of the localized heat source includes moving a printer carriage, where a laser is operatively coupled to the printer carriage.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A graphene printing apparatus comprising:
    a print surface bed configured to have a substrate placed thereon that is metallic, silicon, or oxide;
    a gas source of a graphene precursor gas;
    a heat source;
    a processor; and
    a memory storing program code that, upon execution by the processor, is configured to:
        cause the graphene precursor gas to flow from the gas source across the substrate placed on the print surface bed and that is metallic, silicon, or oxide; and
        cause the heat source to locally heat portions of the substrate that is metallic, silicon, or oxide according to a printing pattern such that graphene grows in correspondence with the printing pattern at the portions of the substrate that is metallic, silicon, or oxide upon subsequent cooling.

2. The apparatus as defined in claim 1, wherein the heat source comprises a laser device.

3. The apparatus as defined in claim 1 wherein the heat source comprises an electron beam or a vertical cavity surface emitting laser (VCSEL) array.

4. The apparatus as defined in claim 1, wherein the gas source comprises an emitter movable or orientable along with the heat source,
    and wherein the program code, upon execution by the processor, is configured to cause the graphene precursor gas to flow by aiming or directing the emitter to direct the graphene precursor gas onto the portions according to the printing pattern.

5. The apparatus as defined in claim 1, further comprising a movable printhead configured to move the heat source relative to the substrate in at least one of an x-direction, a y-direction, and a z-direction.

6. The apparatus as defined in claim 1, further comprising an actuator configured to rotate the localized heat source based on the printing pattern.

7. The apparatus as defined in claim 1, wherein the substrate includes copper.

8. The apparatus as defined in claim 1, wherein the heat source is disposed under a first surface of the substrate that is opposite to a second surface of the substrate above which the gas source of the graphene precursor gas is disposed,
    and wherein the program code upon execution by the processor, is configured to cause the heat source to locally heat the portions according to the printing pattern by causing the heat source to locally heat the portions from the first surface under which the heat source is disposed.

9. The apparatus as defined in claim 1, further comprising a chamber in which the print surface bed is disposed.

10. A method comprising:
    causing, by a processor, a graphene precursor gas to flow from a gas source across a substrate placed on a print surface bed and that is metallic, silicon, or oxide; and
    causing, by the processor, a heat source to locally heat portions of the substrate that is metallic, silicon, or oxide according to a printing pattern such that graphene grows in correspondence with the printing pattern at the portions of the substrate that is metallic, silicon, or oxide upon subsequent cooling.

11. The method as defined in claim 10, wherein the gas source comprises an emitter movable or orientable along with the heat source,
    and wherein causing, by the processor, the graphene precursor gas to flow comprises aiming or directing the emitter to direct the graphene precursor gas onto the portions according to the printing pattern.

12. The method as defined in claim 10, wherein the heat source is disposed under a first surface of the substrate that is opposite to a second surface of the substrate above which the gas source of the graphene precursor gas is disposed, and wherein causing, by the processor, the heat source to locally heat the portions according to the printing pattern comprises causing the heat source to locally heat the portions from the first surface under which the heat source is disposed.

13. A non-transitory computer-readable data storage medium storing program code executable by a processor to perform processing comprising:

causing a graphene precursor gas to flow from a gas source across a substrate placed on a print surface bed and that is metallic, silicon, or oxide; and causing a heat source to locally heat portions of the substrate that is metallic, silicon, or oxide according to a printing pattern such that graphene grows in correspondence with the printing pattern at the portions of the substrate that is metallic, silicon, or oxide upon subsequent cooling.

14. The non-transitory computer-readable data storage medium as defined in claim 13, wherein the gas source comprises an emitter movable or orientable along with the heat source, and wherein causing the graphene precursor gas to flow comprises aiming or directing the emitter to direct the graphene precursor gas onto the portions according to the printing pattern.

15. The non-transitory computer-readable data storage medium as defined in claim 13, wherein the heat source is disposed under a first surface of the substrate that is opposite to a second surface of the substrate above which the gas source of the graphene precursor gas is disposed, and wherein causing the heat source to locally heat the portions according to the printing pattern comprises causing the heat source to locally heat the portions from the first surface under which the heat source is disposed.

* * * * *